United States Patent
Kim

(10) Patent No.: US 9,548,412 B2
(45) Date of Patent: Jan. 17, 2017

(54) SOLAR CELL MODULE AND METHOD OF FABRICATING THE SAME

(71) Applicant: LG INNOTEK CO., LTD., Seoul (KR)

(72) Inventor: Kyung Am Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 295 days.

(21) Appl. No.: 14/359,787

(22) PCT Filed: Nov. 21, 2012

(86) PCT No.: PCT/KR2012/009868
§ 371 (c)(1),
(2) Date: May 21, 2014

(87) PCT Pub. No.: WO2013/077627
PCT Pub. Date: May 30, 2013

(65) Prior Publication Data
US 2014/0318606 A1    Oct. 30, 2014

(30) Foreign Application Priority Data

Nov. 21, 2011    (KR) .................. 10-2011-0121876

(51) Int. Cl.
*H01L 31/044* (2014.01)
*H01L 31/05* (2014.01)
*H01L 31/0224* (2006.01)
*H01L 31/048* (2014.01)
*H02S 40/34* (2014.01)

(52) U.S. Cl.
CPC ... *H01L 31/0504* (2013.01); *H01L 31/022425* (2013.01); *H01L 31/048* (2013.01); *H01L 31/0488* (2013.01); *H02S 40/34* (2014.12); *Y02E 10/50* (2013.01)

(58) Field of Classification Search
CPC ....... H01L 31/00–31/078; Y02E 10/50–10/60; H02S 40/34–40/345
USPC .................................................. 136/243–265
See application file for complete search history.

(56) References Cited

U.S. PATENT DOCUMENTS

| | | | |
|---|---|---|---|
| 2006/0219291 A1 | 10/2006 | Hikosaka et al. | |
| 2012/0174958 A1* | 7/2012 | Park ................ | H01L 31/0201 136/244 |
| 2012/0216849 A1 | 8/2012 | Cho | |

FOREIGN PATENT DOCUMENTS

| | | |
|---|---|---|
| CN | 201732786 U | 2/2011 |
| KR | 10-2006-0105535 A | 10/2006 |
| KR | 10-2010-0109322 A | 10/2010 |
| KR | 10-2011-0035788 A | 4/2011 |

(Continued)

OTHER PUBLICATIONS

Office Action dated Sep. 7, 2015 in Chinese Application No. 201280067687.X.

(Continued)

*Primary Examiner* — Bach Dinh
(74) *Attorney, Agent, or Firm* — Saliwanchik, Lloyd & Eisenschenk

(57) ABSTRACT

Disclosed are a solar cell module and a method of fabricating the same. The solar cell module includes a support substrate, solar cells at an upper portion of the support substrate, bus bars electrically connected to the solar cells, a junction box connected to the bus bars, and an upper substrate at an upper portion of the solar cells. The junction box is formed therein with pad electrodes connected to the bus bars.

17 Claims, 2 Drawing Sheets

(56) References Cited

FOREIGN PATENT DOCUMENTS

KR  10-2011-0054907 A      5/2011
KR  WO2011040784     *    7/2011

OTHER PUBLICATIONS

International Search Report in International Application No. PCT/KR2012/009868, filed Nov. 21, 2012.

* cited by examiner

SOLAR CELL MODULE AND METHOD OF FABRICATING THE SAME

CROSS-REFERENCE TO RELATED APPLICATIONS

This application is the U.S. national stage application of International Patent Application No. PCT/KR2012/009868, filed Nov. 21, 2012, which claims priority to Korean Application No. 10-2011-0121876, filed Nov. 21, 2011, the disclosures of each of which are incorporated herein by reference in their entirety.

TECHNICAL FIELD

The disclosure relates to a solar cell module and a method of fabricating the same. In more particular, the disclosure relates to a solar cell module capable of representing improved reliability and improved productivity and a method of fabricating the same.

BACKGROUND ART

Recently, as the lack of an energy resource such as petroleum or coal is expected, the interest in the substitute energy has been more increased. In this regard, a solar cell converting solar energy into electrical energy is spotlighted.

A solar cell (or photovoltaic cell) is a core element in solar power generation to directly convert solar light into electricity.

For example, if the solar light having energy greater than band-gap energy of a semi-conductor is incident into a solar cell having the PN junction structure of a semi-conductor, electron-hole pairs are generated. As electrons and holes are collected into an N layer and a P layer, respectively, due to the electric field formed in a PN junction part, photovoltage is generated between the N and P layers. In this case, if a load is connected to electrodes provided at both ends of the solar cell, current flows through the solar cell.

The current generated from the solar cell is connected to a junction box through a bus bar. In general, in order to connect the bus bar formed on the top surface of a solar cell panel to the junction box, holes having positive and negative polarities are formed in a solar cell substrate. In order to form the holes, an additional process is required for the substrate, and the number of the processes may be increased. In addition, the solar cell substrate may be damaged due to the cracks between the holes.

DISCLOSURE OF INVENTION

Technical Problem

The embodiment provides a solar cell module and a method of fabricating the same, capable of connecting a bus bar to a junction box without forming the holes in a solar cell substrate so that a process of forming holes can be omitted, thereby improving the productivity and the reliability.

Solution to Problem

According to the embodiment, there is provided a solar cell module. The solar cell module includes a support substrate, solar cells at an upper portion of the support substrate, bus bars electrically connected to the solar cells, a junction box connected to the bus bars, and an upper substrate at an upper portion of the solar cells. The junction box is formed therein with pad electrodes connected to the bus bars.

Advantageous Effects of Invention

Since holes are not formed in the solar cell module according to the embodiment, the manufacturing processes can be reduced, so that the productivity can be improved.

In addition, the defect rate that may occur in the process of forming the holes in the support substrate can be reduced.

BEST MODE FOR CARRYING OUT THE INVENTION

Figure 1:
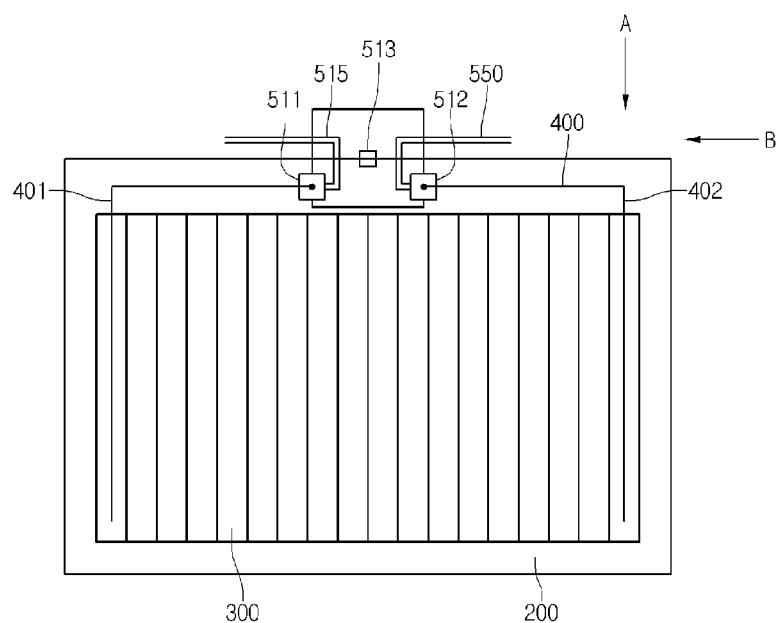
FIG. 1 is a top view showing a support substrate of a solar cell module according to the embodiment.

In the description of the embodiments, it will be understood that when a panel, a bar, a frame, a substrate, a groove, or a film is referred to as being on or under another panel, another bar, another frame, another substrate, another groove, or another film, it can be directly or indirectly on the other panel, the other bar, the other frame, the other substrate, the other groove, or the other film may also be present. Such a position of the layer has been described with reference to the drawings. The size of the elements shown in the drawings may be exaggerated for the purpose of explanation and may not utterly reflect the actual size.

Figure 2:
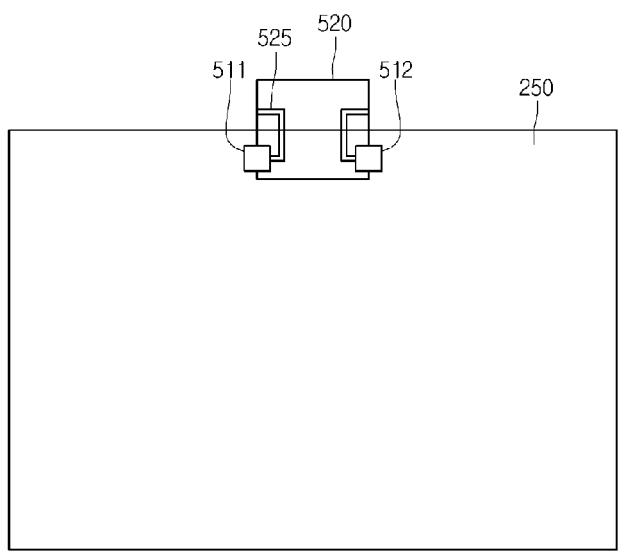
FIG. 2 is a top view showing an upper substrate of the solar cell module according to the embodiment.
Figure 3:
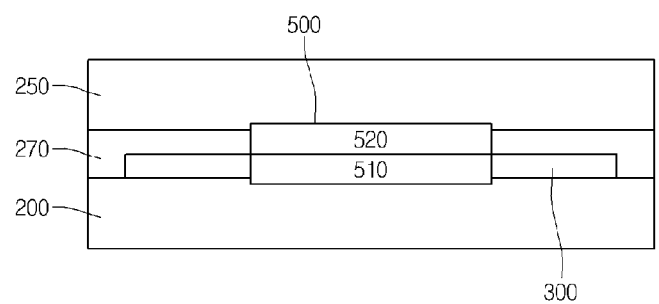
FIG. 3 is a sectional view showing the solar cell module when viewed from reference sign A of FIG. 1.
Figure 4:
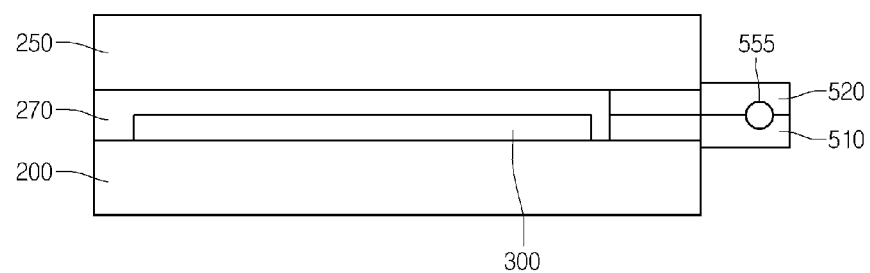
FIG. 4 is a sectional view showing the solar cell module when viewed from reference sign B of FIG. 1.

FIG. 1 is a top view showing a support substrate of a solar cell module according to the embodiment, FIG. 2 is a top view showing an upper substrate of the solar cell module according to the embodiment, FIG. 3 is a sectional view showing the solar cell module when viewed from reference sign A of FIG. 1, and FIG. 4 is a sectional view showing the solar cell module when viewed from reference sign B of FIG. 1.

Referring to FIGS. 1 to 4, the solar cell module according to the embodiment includes solar cells 300, a support substrate 200 to support the solar cells 300, a bus bar 400 electrically connected to the solar cells 300, and a junction box 500 connected to the bus bar 400. The junction box 500 is provided on one surface thereof with pads 511 and 512 connected to the bus bar 400.

The support substrate 200 may include an insulator. The support substrate 200 may include a glass substrate, a plastic substrate, or a metallic substrate. In more detail, the support substrate 200 may include a soda lime glass substrate. The support substrate 200 may be transparent. The support substrate 200 may be rigid or flexible.

The solar cells 300 may be formed on the support substrate 200, and may have a plate shape. For example, the solar cells 300 may have the shape of a rectangular plate. The solar cells 300 are provided inside a frame. In more detail, the outer portion of the solar cells 300 is provided inside the frame. In other words, four lateral sides of each solar cell are provided inside the frame. The solar cells 300 receive the solar light and convert the solar light into electrical energy.

The frame (not shown) may be provided at the lateral sides of the solar cells 300 to receive the solar cells 300. For example, the frame is provided at four lateral sides of the solar cells 300. The frame may include metal such as aluminum (Al).

The solar cells 300 are provided at the upper portion thereof with a protective layer 270 to protect the solar cells 300, and an upper substrate 250 is provided on the protective layer 300. The above parts may be integrated with each other through a lamination process.

The upper substrate 250 and the support substrate 200 protect the solar cells 300 from an external environment. The upper substrate 250 and the support substrate 200 may have a multiple-layer structure including a layer preventing moisture and oxygen from being infiltrated, a layer preventing chemical corrosion, and a layer having an insulating characteristic.

The protective layer 270 is integrally formed with the solar cells 300 through a lamination process in the state that the protective layer 270 is provided on the solar cells 300. In addition, the protective layer 270 protects the solar cells 300 from being corroded due to moisture infiltration, and protects the solar cells 300 from the shock. The protective layer 270 may include ethylene vinyl acetate (EVA). The protective layer 270 may be provided under the solar cells 300.

The upper substrate 250 provided on the protective layer 270 includes tempered glass representing high transmittance and having a superior anti-breakage function. In this case, the tempered glass may include low iron tempered glass including the low content of iron. The upper substrate 250 has an embossed inner side in order to enhance the scattering of light.

The bus bar 400 is connected to the solar cells 300. For example, the bus bar 400 is provided on the top surface of the outermost solar cells 300. The bus bar 400 may directly make contact with the top surface of the outermost solar cells 300. A bus bar 401 formed at one end portion of the solar cells 300 and a bus bar 402 formed at an opposite end portion of the solar cells 300 may be connected to the solar cells 300 when representing different polarities. For example, if the bus bar 401 formed at the one end of the solar cells 300 is operated with a positive polarity, the bus bar 402 formed at the opposite end of the solar cells 300 is operated with a negative polarity.

The junction box 500 is electrically connected to the solar cells 300.

The junction box 500 may be divided into a lower junction box 510 provided on the top surface of the support substrate 200 and an upper junction box 520 provided on the bottom surface of the upper substrate 250. Each of the junction boxes 510 and 520 is provided on one surface thereof with a pad electrode provided at the contact position with the bus bar 400 so that the junction boxes 510 and 530 may be electrically connected to the bus bar 400.

In detail, the lower pad electrodes 511 and 512 are formed on the top surface of the lower junction box 510. The lower pad electrodes 511 and 512 have patterns sufficient to make contact with the bus bar 400. In detail, the lower pad electrodes 511 and 512 may be formed at the positions corresponding to those of the bus bars 401 and 402 so that the lower pad electrodes 511 and 512 make contact with the bus bar 401 and 402, respectively.

In addition, the upper junction box 520 is provided on the bottom surface thereof with upper pad electrodes 521 and 522. The upper pad electrodes 521 and 522 have patterns sufficient to make contact with the bus bar 400. In detail, the upper pad electrodes 521 and 522 may be formed at the positions corresponding to those of the bus bars 401 and 402 so that the upper pad electrodes 521 and 522 may make contact with the bus bar 401 and 402, respectively.

The lower and upper junction boxes 510 and 520 may be coupled with each other to serve one junction box. Each of the junction boxes 510 and 520 may be provided at a lateral side thereof with a cable connection hole 555 (see FIG. 4) so that the junction boxes 510 and 520 may be electrically connected to a cable 550.

The cable connection holes 555 may be formed in the semicircular shapes at the lower and upper junction boxes 510 and 520 so that the cable connection holes 555 may form a circle when the lower and upper junction boxes are coupled with each other. The shape of the holes 555 is not limited to a circle.

The junction box 500 may be connected to the cable 550 through the holes 555. The junction box 500 may include a connection part 515 so that the current input from the bus bar 400 may be applied to the cable 550 through the electrode pads 511 and 512.

The connection part 515 may include a material representing superior electrical conductivity. For example, the connection part 515 may include a material the same as materials constituting the electrode pads 511 and 512 and may be patterned through the same process as that of the electrode pads 511 and 512. Although the connection part 515 may be patterned in a substantially C shape according to the embodiment, the embodiment is not limited thereto.

In general, the support substrate 200 is formed in one surface thereof with holes so that the bus bars operated with positive and negative polarities are connected to the junction box formed on the bottom surface of the support substrate 200. However, the number of the processes is increased in the above procedure. When the holes are formed in the support substrate 200, the support substrate 200 may be broken, so that the reliability and the productivity may be degraded.

According to the embodiment, one surface of the junction box 500 is patterned, in such a manner that the junction box 550 is directly connected to the bus bar 400 through the pad electrode, thereby overcoming the above problem.

The junction box 500 may include a by-pass diode, and may receive the circuit board connected to the bus bar 400 and the cable 550.

In addition, the solar cell module according to the embodiment may further include a wire to connect the bus bar 400 to the printed circuit board. The cable 550 is connected to the printed circuit board, and electrically connected to the solar cells 300 through the connection part 515 of the junction box 500.

Hereinafter, a process of forming a solar cell module according to the embodiment will be described with reference to FIGS. 3 and 4. The lower junction box 510 is formed on the solar cells 300. The lower pad electrodes 511 and 512 are patterned on the lower junction box 510, and then the bus bar 400 is formed in such a manner that the bus bar 400 makes contact with the lower pad electrodes 511 and 512.

Thereafter, after placing the upper junction box 520 corresponding to the lower junction box 510, the protective layer 270 is formed. In this case, the upper pad electrodes 521 and 522 may be formed on the bottom surface of the upper junction box 520 corresponding to the lower pad electrodes 511 and 512 formed on the top surface of the lower junction box 510. As described above, since the lower pad electrodes 511 and 512 are formed simultaneously with the upper pad electrodes 521 and 522, the contact resistance between the bus bar 400 and the pad electrodes may be decreased, and the photoelectric conversion efficiency of the solar cell can be improved.

Subsequently, the protective layer 270 is formed on the top surface and the lateral side of the solar cells 300 through a lamination process to make contact with the support substrate 200. The solar cells 300 and the protective layer 270 may have widths smaller than those of the support substrate 200 and the upper substrate 250.

The protective layer 270 covers the top surface of the junction box 500, so that the solar cells 300 can be electrically connected to the junction box 500 through one lamination process.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
   a support substrate;
   solar cells at an upper portion of the support substrate;
   bus bars electrically connected to the solar cells;
   a junction box connected to the bus bars; and
   an upper substrate at an upper portion of the solar cells,
   wherein the junction box is disposed therein with pad electrodes connected to the bus bars and comprises a lower junction box disposed on a top surface of the support substrate and an upper junction box disposed on a bottom surface of the upper substrate, and
   wherein the pad electrodes are disposed on a top surface of the lower junction box and a bottom surface of the upper junction box and are connected to the bus bars, respectively.

2. The solar cell module of claim 1, wherein the bus bars are disposed at both end portions of the solar cells, and the pad electrodes are connected to the bus bars, respectively.

3. The solar cell module of claim 1, wherein the support substrate and the upper substrate have widths wider than widths of the solar cells.

4. The solar cell module of claim 1, further comprising a protective layer disposed on the upper portion of the solar cells.

5. The solar cell module of claim 4, wherein a thickness of the junction box less than a total thickness of the upper substrate, the protective layer and the support substrate.

6. The solar cell module of claim 1, wherein the pad electrodes comprise a lower pad electrode on the top surface of the lower junction box and
   an upper pad electrode at a position corresponding to a position of the lower pad electrode on the bottom surface of the upper junction box.

7. The solar cell module of claim 1, wherein the lower and upper junction boxes are provided at lateral sides thereof with holes.

8. The solar cell module of claim 7, wherein the holes are cable connection holes, and wherein the cable connection holes comprise semicircular shapes at the lower and upper junction boxes.

9. The solar cell module of claim 8, wherein the cable connection holes are spaced apart from the support substrate and the upper substrate.

10. The solar cell module of claim 1, wherein the junction box includes connection parts connected to the pad electrodes, and the connection parts are electrically connected to a cable.

11. The solar cell module of claim 10, wherein the connection parts include a material the same as materials constituting the pad electrodes.

12. The solar cell module of claim 10, wherein the connection parts have a substantially C-shape section.

13. The solar cell module of claim 1, wherein the junction box is disposed at lateral sides of the upper substrate and the support substrate.

14. The solar cell module of claim 1, wherein the junction box includes a by-pass diode.

15. The solar cell module of claim 1, wherein the bus bars are disposed between the solar cells and the pad electrodes.

16. The solar cell module of claim 1, wherein the pad electrodes are disposed in the support substrate and the upper substrate.

17. The solar cell module of claim 1, wherein the connection parts are disposed in the junction box, and are disposed at inside and outer side of the support substrate.

* * * * *